United States Patent
Im et al.

(10) Patent No.: US 6,573,531 B1
(45) Date of Patent: Jun. 3, 2003

(54) SYSTEMS AND METHODS USING SEQUENTIAL LATERAL SOLIDIFICATION FOR PRODUCING SINGLE OR POLYCRYSTALLINE SILICON THIN FILMS AT LOW TEMPERATURES

(75) Inventors: James S. Im, New York, NY (US); Robert S. Sposili, New York, NY (US); Mark A. Crowder, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 09/390,537

(22) Filed: Sep. 3, 1999

(51) Int. Cl.[7] .............................................. H01L 29/04
(52) U.S. Cl. ........................... 257/45; 257/75; 438/166; 438/481; 438/486; 438/488
(58) Field of Search ......................... 117/37, 43, 44–46, 117/54, 56, 73, 74, 904, 923; 257/45, 75; 438/149, 166, 479, 481, 486, 488

(56) References Cited

U.S. PATENT DOCUMENTS

| | | | |
|---|---|---|---|
| 4,970,546 A | 11/1990 | Suzuki et al. | |
| 5,145,808 A | 9/1992 | Sameshima et al. | |
| 5,529,951 A | * 6/1996 | Noguchi et al. | 437/174 |
| 5,756,364 A | * 5/1998 | Tanaka et al. | 437/21 |
| 5,893,990 A | 4/1999 | Tanaka | |
| 6,117,752 A | 9/2000 | Suzuki | |
| 6,120,976 A | * 9/2000 | Treadwell et al. | 430/322 |
| 6,313,435 B1 | * 11/2001 | Shoemaker et al. | 219/121.7 |

FOREIGN PATENT DOCUMENTS

| | | |
|---|---|---|
| EP | 1 067 593 A2 | 1/2001 |
| GB | 2338342 | 12/1999 |
| JP | 11 064883 | 3/1999 |
| WO | WO 98/24118 | 6/1998 |
| WO | WO 99/31719 | 6/1999 |
| WO | 0118854 | 3/2001 |
| WO | 0118855 | 3/2001 |

OTHER PUBLICATIONS

S.D. Brotherton et al., "Influence of Melt Depth in Laser Crystallized Poly–Si Thin Film Transistors," 82 J. Appl. Phys. 4086 (1997).

J.S. Im et al., "Crystalline Si Films for Integrated Active–Matrix Liquid–Crystals Displays," 21 MRS Bulletin 39 (1996).

(List continued on next page.)

*Primary Examiner*—Long Pham
*Assistant Examiner*—Wai-Sing Louie
(74) *Attorney, Agent, or Firm*—Baker Botts L.L.P.

(57) ABSTRACT

System and methods for processing an amorphous silicon thin film sample into a single or polycrystalline silicon thin film are disclosed. The system includes an excimer laser for generating a plurality of excimer laser pulses of a predetermined fluence, an energy density modulator for controllably modulating fluence of the excimer laser pulses, a beam homoginizer for homoginizing modulated laser pulses in a predetermined plane, a mask for masking portions of the homoginized modulated laser pulses into patterned beamlets, a sample stage for receivingthe patterned beamlets to effect melting of portions of any amorphous silicon thin film sample placed thereon corresponding to the beamlets, translating means for controllably translating a relative position of the sample stage with respect to a position of the mask and a computer for controlling the controllable fluence modulation of the excimer laser pulses and the controllable relative positions of the sample stage and mask, and for coordinating excimer pulse generation and fluence modulation with the relative positions of the sample stage and mask, to thereby process amorphous silicon thin film sample into a single or polycrystalline silicon thin film by sequential translation of the sample stage relative to the mask and irradiation of the sample by patterned beamlets of varying fluence at corresponding sequential locations thereon.

21 Claims, 9 Drawing Sheets

OTHER PUBLICATIONS

"Overview of Beam Delivery Systems for Excimer Lasers," Micro/Las Lasersystem GMBH.

K.H. Weiner et al., "Ultrashallow Junction Formation Using Projection Gas Immersion Laser Doping (PGILD)," A Verdant Technologies Technical Brief, Aug. 20, 1997.

I.W. Boyd, "Laser Processing of Thin Films and Microstructures, Oxidation, Deposition, and Etching of Insulators" (Springer—Verlag Berlin Heidelberg 1987).

H. Endert et al., "Excimer Laser: A New Tool for Precision Micromaching," 27 Optical and Quantum Electronics, 1319 (1995).

Nebel, C.E., "Laser Interference Structuring of A–SI:h" Amorphous Silicon Technology—1996, San Francisco, CA Apr. 8–12, 1996, Materials Research Society Symposium Proceedings, vol. 420, Pittsburgh, PA.

Jeon, J–H et al., "Two–step laser recrystallization of poly–Si for effective control of grain boundaries", *Journal of Non Crystalline Solids*, North–Holland Publishing Company, NL, vol. 266–269, May 2000, pp. 645–649.

*Im, J.S. et al., "Controlled Super–Lateral Growth of Si Films for Microstructural Manipulation and Optimization," Phys. Status Solid (a), Applied Research, Berlin, Germany, vol. 166, 1998, pp. 603–617, XP002935002, ISN: 0031–8965.

* cited by examiner

SYSTEMS AND METHODS USING SEQUENTIAL LATERAL SOLIDIFICATION FOR PRODUCING SINGLE OR POLYCRYSTALLINE SILICON THIN FILMS AT LOW TEMPERATURES

NOTICE OF GOVERNMENT RIGHTS

The U.S. Government has certain rights in this invention pursuant to the terms of the Defense Advanced Research Project Agency award number N66001-98-1-8913.

BACKGROUND OF THE INVENTION

I. Field of the Invention

The present invention relates to techniques for semiconductor processing, and more particularly to semiconductor processing which may be performed at low temperatures.

II. Description of the Related Art

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bullitin 39 (1996), an overview of conventional excimer laser annealing technology is presented. In such a system, an excimer laser beam is shaped into a long beam which is typically up to 30 cm long and 500 microns or greater in width. The shaped beam is scanned over a sample of amorphous silicon to facilitate melting thereof and the formation of polycrystalline silicon upon resolidification of the sample.

The use of conventional excimer laser annealing technology to generate polycrystalline silicon is problematic for several reasons. First, the polycrystalline silicon generated in the process is typically small grained, of a random microstructure, and having a nonuniform grain sizes, therefore resulting in poor and nonuniform devices and accordingly, low manufacturing yield. Second, in order to obtain acceptable performance levels, the manufacturing throughput for producing polycrystalline silicon must be kept low. Also, the process generally requires a controlled atmosphere and preheating of the amorphous silicon sample, which leads to a reduction in throughput rates. Accordingly, there exists a need in the field to generate higher quality polycrystalline silicon at greater throughput rates.

SUMMARY OF THE INVENTION

An object of the present invention is to provide techniques for growing large grained polycrystalline or single crystal silicon structures using energy-controllable laser pulses.

A further object of the present invention is to utilize small-scale translation of a silicon sample in order to grow large grained polycrystalline or single crystal silicon structures on the sample.

Yet another object of the present invention is to provide techniques for growing location controlled large grained polycrystalline or single crystal silicon structures which yield planarized thin silicon films.

Yet a further object of the present invention is to provide techniques for growing large grained polycrystalline or single crystal silicon structures at low temperatures, for example at room temperature, and without preheating.

A still further object of the present invention is to provide techniques for coordinated attenuation of laser fluence.

In order to achieve these objectives as well as others that will become apparent with reference to the following specification, the present invention provides an excimer laser for generating a plurality of excimer laser pulses of a predetermined fluence, an energy density modulator for controllably modulating fluence of the excimer laser pulses, a beam homoginizer for homoginizing modulated laser pulses in a predetermined plane, a mask for masking portions of the homoginized modulated laser pulses into patterned beamlets, a sample stage for receivingthe patterned beamlets to effect melting of portions of any amorphous silicon thin film sample placed thereon corresponding to the beamlets, translating means for controllably translating a relative position of the sample stage with respect to a position of the mask and a computer for controlling the controllable fluence modulation of the excimer laser pulses and the controllable relative positions of the sample stage and mask, and for coordinating excimer pulse generation and fluence modulation with the relative positions of the sample stage and mask, to thereby process amorphous silicon thin film sample into a single or polycrystalline silicon thin film by sequential translation of the sample stage relative to the mask and irradiation of the sample by patterned beamlets of varying fluence at corresponding sequential locations thereon.

In a preferred arrangement, the excimer laser is a ultraviolet excimer laser, and the energy density modulator includes a rotatable wheel, two or more beam attenuators circumfcrentially mounted on the wheel, and a motor, for controllably rotating the wheel such that each sequential pulse emitted by the laser passed through one of the two or more beam attenuators. Advantageously, the beam attenuators are capable of producing at least two different levels of fluence attenuation.

In an alternative arrangement, the energy density modulator includes a multilayer dialectic plate that is rotatable about an axis perpendicular to a path formed by the excimer pulses, in order to variably fluence modulate the excimer pulses in dependance of an angle formed between the excimer pulse path and the axis of rotation. A compensating plate is advantageously provided to compensate for a dialectic induced shift in the beam path, In another alternative arrangement, the energy density modulator includes one or more beam attenuators and a translating stage for controllably translating the one or more beam attenuators such that each sequential pulse emitted by the laser passes through one of the one or more beam attenuators or passes through the energy density modulator without passing through any of the one or more beam attenuators. The translating stage is movable in both a direction parallel to a path formed by the excimer pulses and a direction perpendicular to the path, and the beam attenuators are positionable such that the excimer pulses pass through one of the one or more beam attenuators or through none of the one or more beam attenuators.

In still another alternative arrangement, the energy density modulator includes one or more movable beam attenuators being controllably moved such that each sequential pulse emitted by the laser passes through one or more of the one or more beam attenuators or passes through the energy density modulator without passing through any of the one or more beam attenuators.

In one preferred arrangement, the translating means includes a mask translating stage that is translatable in both orthogonal directions that are perpendicular to a path formed by the homoginized beams, and a translating stage motor for controllably translating the mask translating stage in both of the translatable directions under control of the computer. In an alternative arrangement, the translating means includes the sample translating stage, and has an X direction translation portion and a Y direction translation portion permitting movement in two orthogonal directions that are perpendicular to a path formed by the patterned beamlets and being controllable by the computer for controllably translating the sample in both of the translatable directions under control of the computer. The sample translation stage may additionally include a Z direction translation portion, for permitting movement of the sample in a direction parallel to the path formed by the patterned beamlets. Most preferably, the entire system is mounted on a granite block to stabilizing the sample from ambient vibration.

The present invention also provides methods for processing an amorphous silicon thin film sample into a single or polycrystalline silicon thin film. In a preferred technique, the method includes the steps of generating a plurality of excimer laser pulses of a predetermined fluence; controllably modulating the fluence of the excimer laser pulses; homoginizing the modulated laser pulses in a predetermined plane; masking portions of the homoginized modulated laser pulses into patterned beamlets, irradiating an amorphous silicon thin film sample with the patterned beamlets to effect melting of portions thereof corresponding to the beamlets; and controllably translating the sample with respect to the patterned beamlets and with respect to the controlled modulation to thereby process the amorphous silicon thin film sample into a single or polycrystalline silicon thin film by sequential translation of the sample relative to the patterned beamlets and irradiation of the sample by patterned beamlets of varying fluence at corresponding sequential locations thereon.

The accompanying drawings, which are incorporated and constitute part of this disclosure, illustrate several preferred embodiment of the invention and serve to explain the principles of the invention.

BRIEF DESCRIPTION OF THE DRAWINGS

FIG. 2b is an illustrative diagram taken along section A–A' of FIG. 2a;

DESCRIPTION OF PREFERRED EMBODIMENTS

Figure 1:
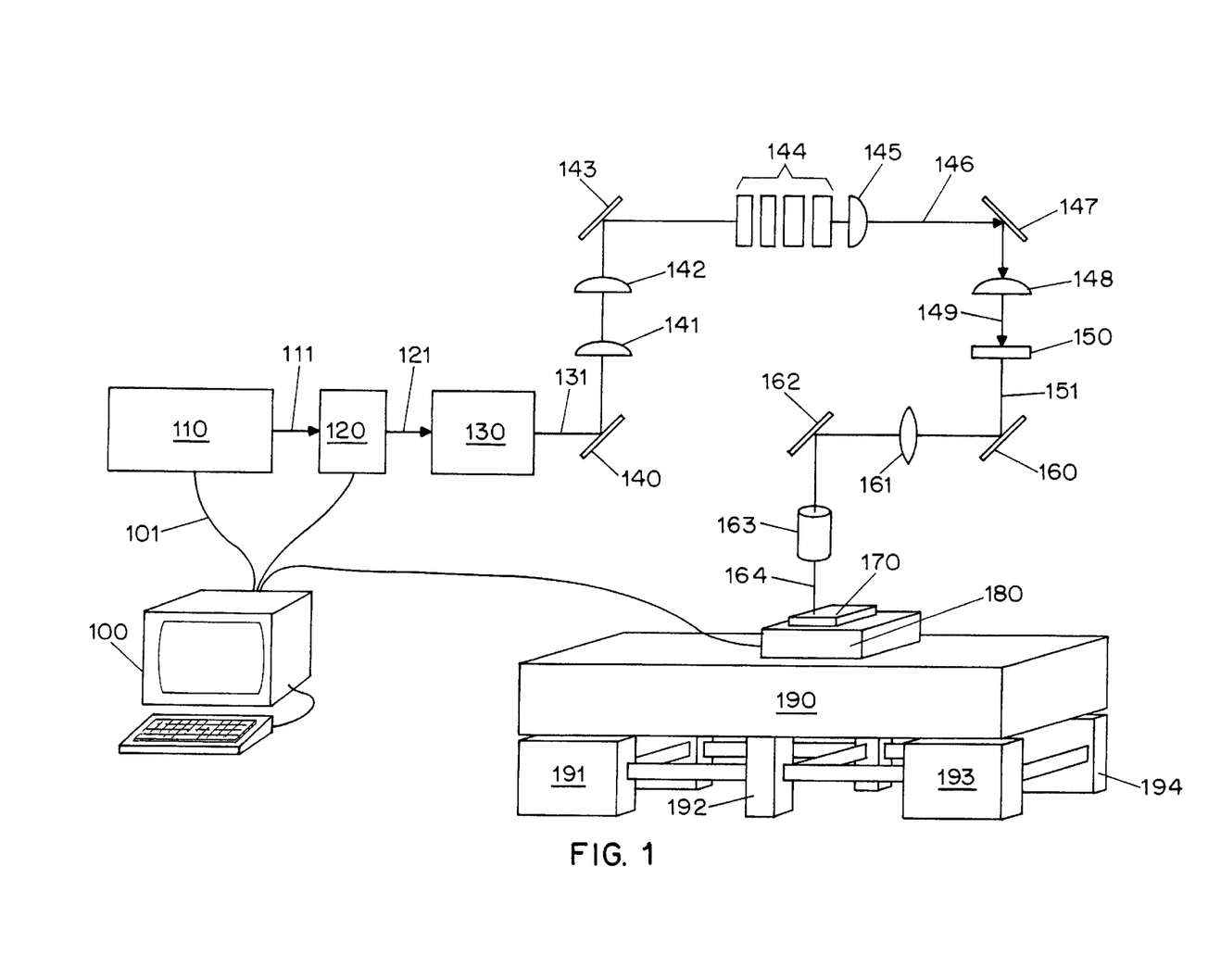
FIG. 1 is a functional diagram of a system in accordance with a preferred embodiment of the present invention.

Referring to FIG. 1, a preferred embodiment of the present invention will be described. An excimer laser 110, which may be Lambda Physik Model LPX315i, generates a laser beam 110 which passes through an energy density modulator 120, described with greater particularity below. While the Lambda Physik excimer laser generates an ultraviolet beam at a wavelength of 308 nm, more powerful excimer lasers or excimer lasers generating beams at other wavelengths may be utilized. In accordance with the present invention, the modulator 120 acts to rapidly change the energy density of laser beam 110. The excimer laser 110 and energy density modulator 120 are each linked by a standard computer interface connection 101 to a computer 100 to effect control of the energy density modulator 120 in accordance with the timing of laser pulses generated by laser 110. The modulated laser beam 121 is directed through beam attenuator and shutter 130, which permit fine control over the fluence of the modulated laser beam.

The fluence controlled laser beam 131 is directed to reflecting surface 140 and through telescoping lenses 141 and 142 to become incident on reflecting surface 143, where it is directed through beam homogenizer 144. The telescoping lenses, which may be two plano-convex lenses 141 and 142 or other well known lens configurations, act to shape the laser beam to match the requirements of beam homogenizer 144. The beam homogenizer, which may be a Microlas beam homogenizer 144, causes the laser beam to gain nearly uniform fluence in the plane of homogenization. The homogenized beam 146 is passed through condensing lens 145, reflected by reflecting surface 147 and passed through field lens 148, which collimates the beam.

The collimated beam 149 passes through masking system 150, which will be described in greater detail below. Patterned beamlets 151 are output from the masking system 150, reflected by reflecting surface 160, passed through an eye lens 161, reflected off reflecting surface 162 and passed through an objective lens 163. Alternatively, the beamlets could be directed to an objective lens 163 without intermediate reflections. The objective lens 162 acts to demagnify and focus the pattern beam 151.

The focused pattern beam 164 is incident on a thin silicon film sample 170, such as a film of amorphous or randomly grained polycrystalline silicon ranging from 100 Angstroms to greater than 5000 Angstroms, deposited on a substrate. In accordance with the preferred invention, the sample 170 is preferably kept at room temperature and does not have to be pre-heated. As further described below, the focused pattern beam 164 is used to laterally solidify the thin silicon sample 170 into a single or uniformly grained polycrystalline film.

The silicon film sample 170 is placed on top of a sample translation stage 180, to be described in greater detail below, which in turn rests on a granite block 190. The granite block 190 is supported by support system 191, 192, 193, 194, 195, 196 which is actively controllable to minimize vibration of the granite block 190 which may be caused by movement in the floor. The granite block must be precision manufactured to have a flat surface, and preferably is of a high grade such as Laboratory Grade AA per federal specification GGG-P-463c.The support system may be a commercially available system from Technical Manufacturing Corporation, which is pneumatically controlled to inhibit the passing of vibrations to the granite block 190. Cross supports between legs 191, 192, 193, 194, 195, 196 may be included for further stability.

Figure 2A:
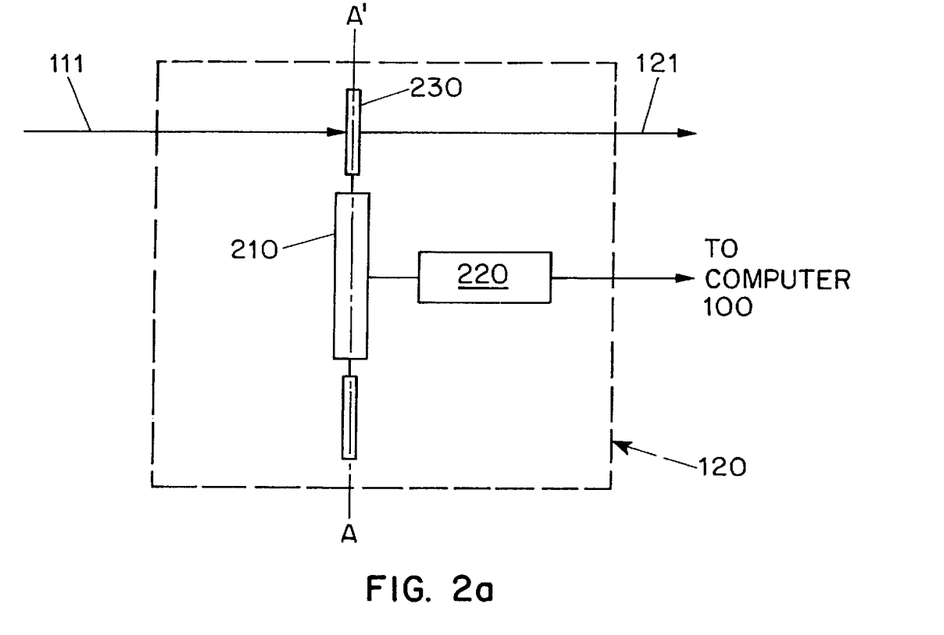
FIG. 2a is an illustrative diagram of an energy density modulator suitable for use in the system of FIG. 1.
Figure 2B:
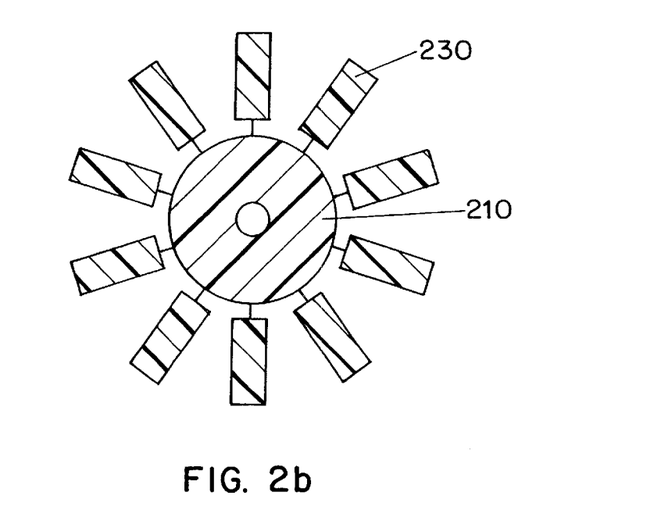

Referring next to FIGS. 2a and 2b, the energy density modulator 120 is described in more detail. FIG. 2a shows a side view of the energy beam modulator 120, which includes a metal wheel 210, motor 220, and a plurality of beam attenuators 230. The motor 220 is a standard stepper motor and includes an encoder so that the motor 220 is able to provide computer 100 with feedback regarding the angular position of wheel 210, and accordingly, the position of each beam attenuator 230. Each beam attenuator 230 is attached to the wheel 220 to permit rotation thereof. Commercially available beam attenuators fabricated from a dielectric coated piece of silicon dioxide or magnesium floride are suitable for use as beam attenuators 230.

For the laser beam generated by the Lambda Physik Model LPX315i, which is approximately 1.5×3 cm, a suitable wheel 210 may be approximately 10–20 cm in diameter and include at least 10 beam attenuators 230, each being at least slightly larger than 1.5×3 cm, circumscribing the wheel 210. FIG. 2b is a diagram taken along cross section A–A' of FIG. 2a., showing ten beam attenuators 230. The number of beam attenuators 230 chosen will depend on the desired grain size, with longer grains requiring more excimer pulses to manufacture, and accordingly, more beam attenuators.

In operation, the energy density modulator 120 and excimer laser 110 are operated in a synchronized manner under the control of computer 100 to achieve the desired attenuation of each laser pulse emitted by the excimer laser 110. For example, if ten excimer pulses are required to properly irradiate a small region of the silicon sample 170 and the excimer laser emits laser pulses at 100 Hz, the wheel 210 would be rotated at ten revolutions per second, or 600 rpm, in synchronicity with the laser pulse emissions. In this example, each laser pulse would be incident on a different beam attenuator 230 when each attenuator was in a position substantially corresponding to the beam path. In accordance with the present invention, the last laser pulses of the pulse set are attenuated in order to planarize the thin silicon film being irradiated. Accordingly, in the foregoing example, the first seven beam attenuators 230 would cause no or little beam attenuation, while the eighth, ninth and tenth beam attenuators would cause increasing fluence attenuation of the incident beam pulses 111.

Figure 3:
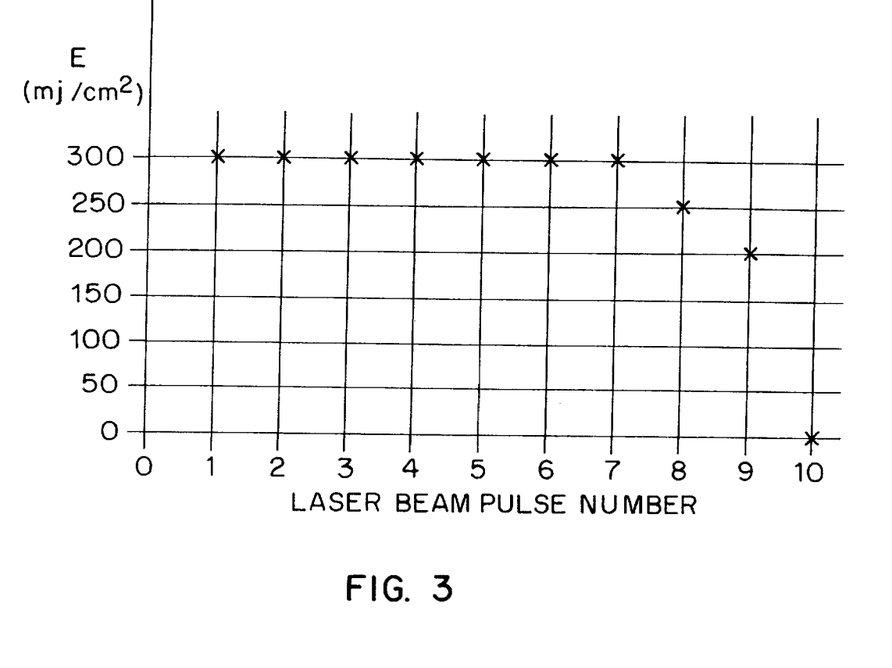
FIG. 3 is a graph showing an illustrative fluence profile of the laser beam pulses shaped by the energy density modulator of FIG. 2.

Thus, as shown in FIG. 3, the energy density modulator 120 changes the fluence profile of the laser beam pulses emitted by excimer laser 110. If the eximer laser is emitting laser beam pulses having a fluence of 300 mJ/cm$^2$, the energy density modulator 120 may be set up to freely pass the first seven pulses, to attenuate the eight pulse to 250 mJ/cm$^2$, the ninth pulse to 200 mJ/cm$^2$, and to completely block the tenth pulse. Of course, the foregoing is merely an example and those skilled in the art will appreciate that other fluence profiles are easily achievable by changing the number of attenuators on wheel 210 and the dielectric coating on each attenuator.

Figure 4:
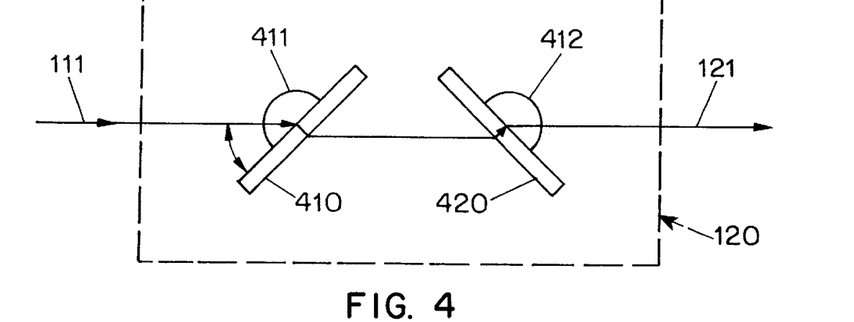
FIGS. 4–6 are illustrative diagrams of alternative energy density modulators suitable for use in the system of FIG. 1.

In an alternative embodiment of the energy density modulator 120 shown with reference to FIG. 4, greater flexibility in configuring the attenuation profile is achieved where the attenuator is coated with a multi-layered dielectric suitable for variable transmittance depending on the incident angle of the incident beam pulse. Thus, a variable beam attenuator 410 controlled by step motor 411 is positioned to receive incident beam pulses 111 and to attenuate the beam in accordance with the angle theta. The attenuated beam 121 is brought back onto the beam axis by passing through a compensating plate 420 which is moved by motor 412 so that the beam attenuator 410 and compensating plate 420 are at opposing angles with respect to the beam axis. As with the embodiment shown in FIG. 2, the beam attenuator is rotated under the control of computer 100 to synchronize the timing of the laser beam pulses emitted by the laser 110 and the attenuation caused by the energy density modulator 120.

Figure 5A:
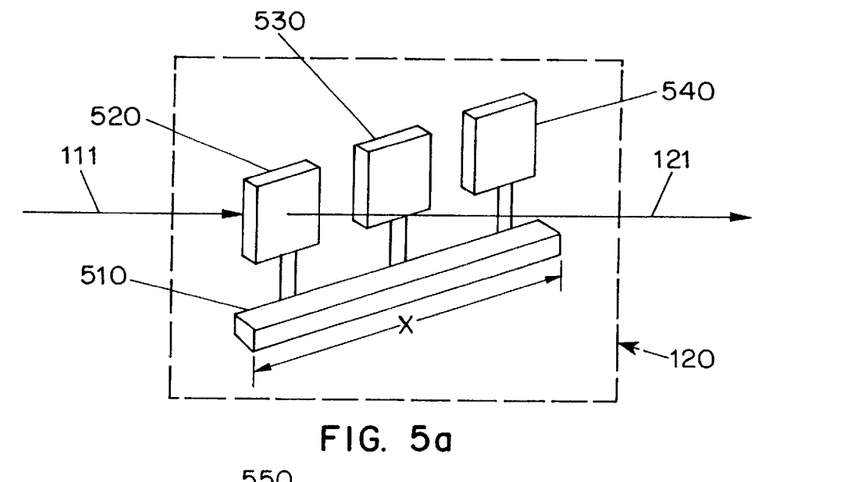
Figure 5B:
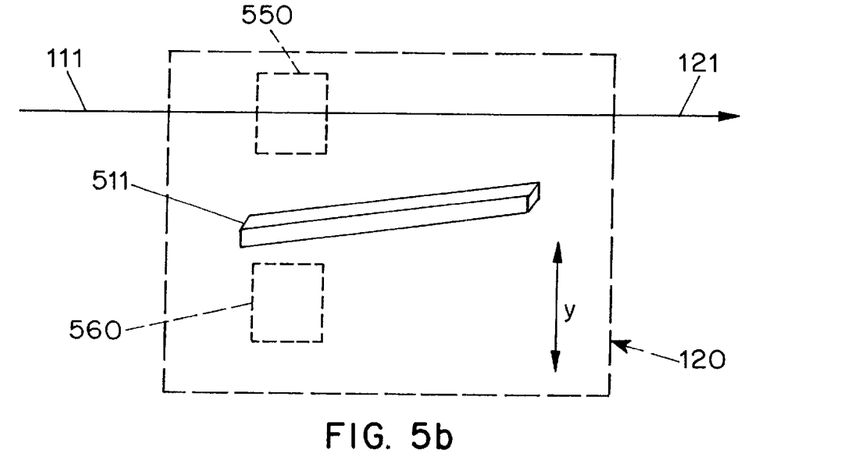

Referring next to FIGS. 5a and 5b, a translational energy density modulator suitable for use in the system of FIG. 1 will now be described. As shown in FIG. 5a, the embodiment includes a translating stage 510 to which several beam attenuators 520, 530, 540 of varied attenuation are attached. In operation, the translating stage would be positioned by computer 100 such that the laser beam 111 does not pass through any attenuator during the initial excimer pulses. Towards the end of a pulse cycle, the translating stage is moved so that the beam 111 passes through attenuations 520, 530, 540, to become an increasingly attenuated beam 121. The computer synchronizes the movement of the translating stage 510 such that each sequential excimer pulse passes through the center of the respective attenuations. One drawback of this embodiment is that the stage will be positioned to maximally attenuate the first pulse of the immediately succeeding pulse cycle. However, this drawback can be overcome if the attenuating stage includes two orthogonal degrees of freedom, as shown in FIG. 5b. The beam translators 550 can be positioned to intersect the beam path when attenuation is desired towards the end of a pulse cycle, and moved out of the way of the beam path 560 prior to initiation of a succeeding cycle, as indicated by the y direction, and translated in the X direction to an initial position while non attenuated beams are desired.

Figure 6:
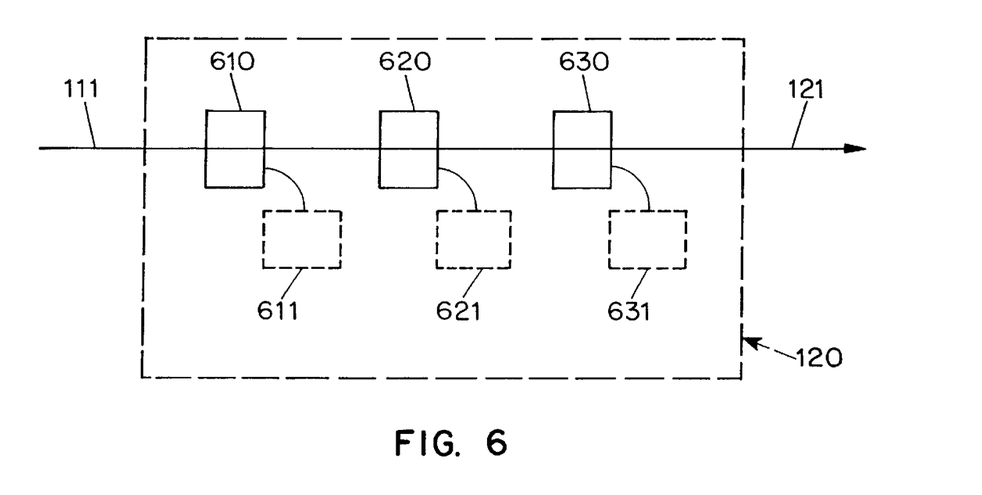

Referring next to FIG. 6, a movable multi-plate energy density modulator suitable for use in the system of FIG. 1 will now be described. The embodiment includes several beam attenuators, each of which is movable to be positioned either in the path 610, 620, 630 of incident beam 111 or outside of the beam path 611, 621, 631. The attenuators may be movable in a direction perpendicular to the beam path, or may be pivoting or rotatable to move in and out of the beam path. In operation, computer 100 positions each attenuator such that the laser beam 111 does not pass through any attenuator during the initial excimer pulses. Towards the end of a pulse cycle, the computer causes the attenuators to be moved so that the beam 111 passes through one or more attenuations to become an increasingly attenuated beam 121 in accordance with the desired modulation profile. The computer synchronizes the movement of the attenuators such that each sequential excimer pulse passes through the center of all attenuators that are placed in the beam path. It should be understood that in operation, it may be desirable to pass several excimer pulses through the same attenuation, or to vary the attenuation scheme in any other manner to achieve the desired attenuation profile.

Figure 7:
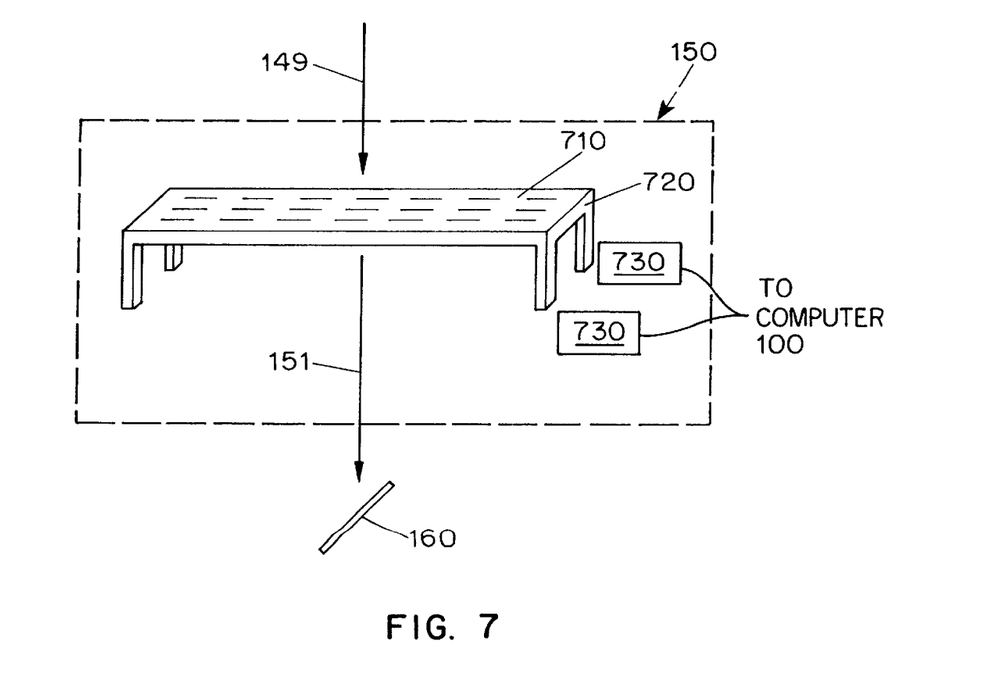
FIG. 7 is an illustrative diagram of a masking system suitable for use in the system of FIG. 1.

Referring next to FIG. 7, the masking system 150 is described in more detail. Homogenized and columnated beam 149, passes through mask 710 which contains a pattern thereon. The mask 710 may be a chrome or dielectric coated fused silica slab, and should include a pattern, such as an array of slits or chevrons, which have been etched from the coating. The mask 710 rests upon an open frame XY translation stage 720 which is controlled by X and Y axis motors 730 under the direction of computer 100. Movement of the XY translation stage 720 permits crystal growth within the silicon sample 170, as will be described below. Alternatively, the mask could rest upon a fixed open frame stage, with beam translation being effected by the sample translator 180. As described in detail in commonly assigned application Ser. No. 09/200,533, filed on Nov. 27, 1996, the disclosure of which is incorporated by reference herein, the slit array mask enables the production of large grained polycrystalline silicon having a substantially uniform grain structure, while the chevron array mask enables the production of location controlled, large single crystal silicon regions.

Figure 8:
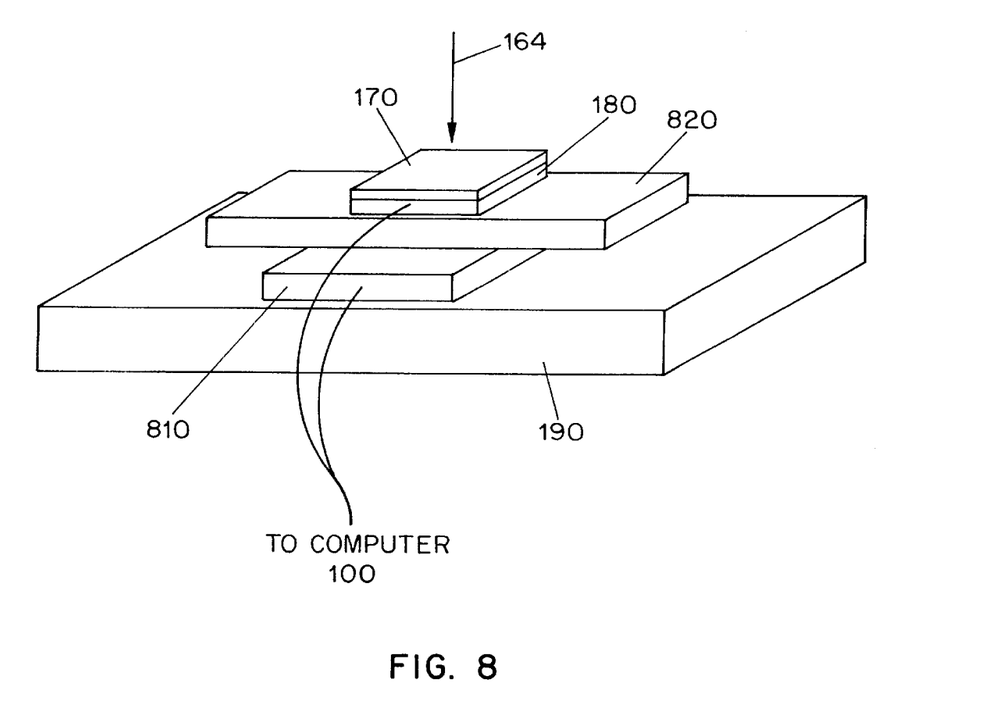
FIG. 8 is an illustrative diagram of a sample translation stage suitable for use in the system of FIG. 1.

Referring next to FIG. 8, the sample translation stage 180 is described in more detail. The stage may include a linear motor/air bearing translation stage, for example an Aerotech ATS 8000 model stage. Thus, the Aerotech stage includes X and Y direction translators 810, 820, and is controllable by computer 100. A separate Z direction translator 830, also controllable by computer 100, is preferably included. The silicon sample 170 is rested on the Z direction translator 830 in the path of masked beam 164.

In operation, the computer 100 controls the movement of either the sample translation stage 180 or the mask translation stage 720 in accordance with the timing of the pulses generated by excimer laser 110 to effect the desired crystal growth in silicon sample 170. Either the sample 170 is moved with respect to the incident pulse 164, or alternatively, the location of the pulse 164 is moved with respect to the sample 170 through mask translation stage.

In order to grow large grained silicon structures, small-scale translation occurs in between each excimer pulse of a pulse set until the final pulse of the pulse set has been absorbed by the sample 170. As each pulse is absorbed by the sample, a small area of the sample is caused to melt and resolidify into a crystal region initiated by the initial pulse of a pulse set. Of course, the number of pulses in a pulse set will define the size of the grain that can be produced, with more pulses enabling the growth of larger sized crystals. Thus, since crystal structures having lengths varying from approximately 0.5 microns to 2 microns may be produced from a single pulse, it should be understood that crystal structures which obtain lengths of 10s of microns may be generated by a suitable set of pulses.

Figure 9A:
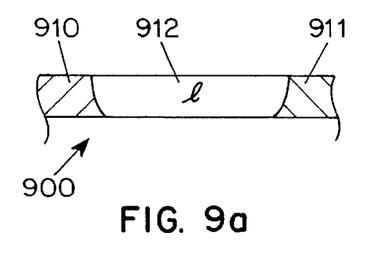
FIG. 9 is an illustrative diagram showing the formation and avoidance of a mount in the region where two crystals meet.
Figure 9B:
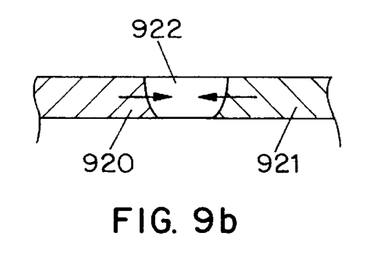
Figure 9C:
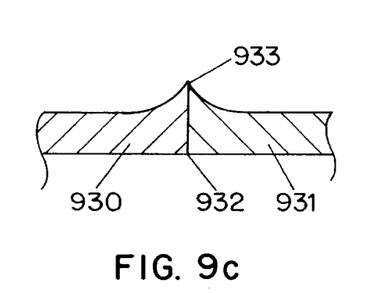

In order to avoid surface protrusions near the last place in the crystal to solidify, the last pulses of a pulse set are attenuated. Referring to FIGS. 9a–9c, when a silicon thin film 900 is irradiated with an excimer laser pulse having sufficient energy to effect complete melt through of the film 900, a liquid area 912 is formed in between two solid areas 911, 912. Two crystal fronts 921, 922 form and grow into the narrowing liquid area 922 until all liquid silicon has crystallized as part of crystals 930, 931. Since silicon is denser when in the liquid phase than when in the solid phase, the volume of the silicon film increases as the silicon solidifies, thereby forming a mount 933 where the two crystals 930, 931 meet 932.

Figure 9D:
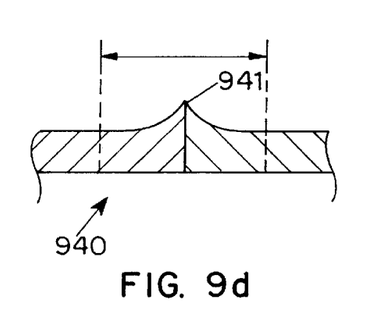
Figure 9E:
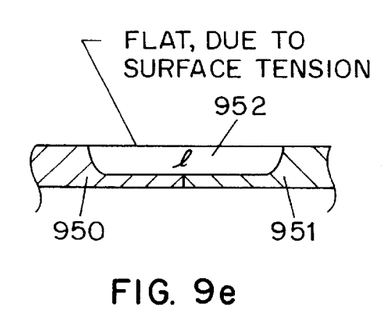
Figure 9F:
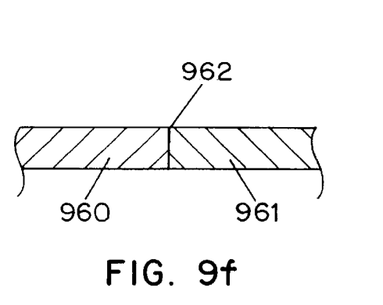

In accordance with the present invention, one or more attenuated pulses are applied to the thin film, either after the long polycrystalline or single crystalline silicon structures have been formed or near the end of the formation of such structures. Referring to FIGS. 9d–9f, when an attenuated laser pulse is applied to the silicon film 940 in the region of a mount 941, the top surface of the film is liquified 952, leaving neighboring crystals 950, 951 adjoining at the bottom surface of the film. Since there can be no lateral crystal growth of crystals 950, 951, the crystals grow upward 960, 961 to form crystal boundary which either has no mount or a far less pronounced mount 962 than mount 941.

Figure 10:
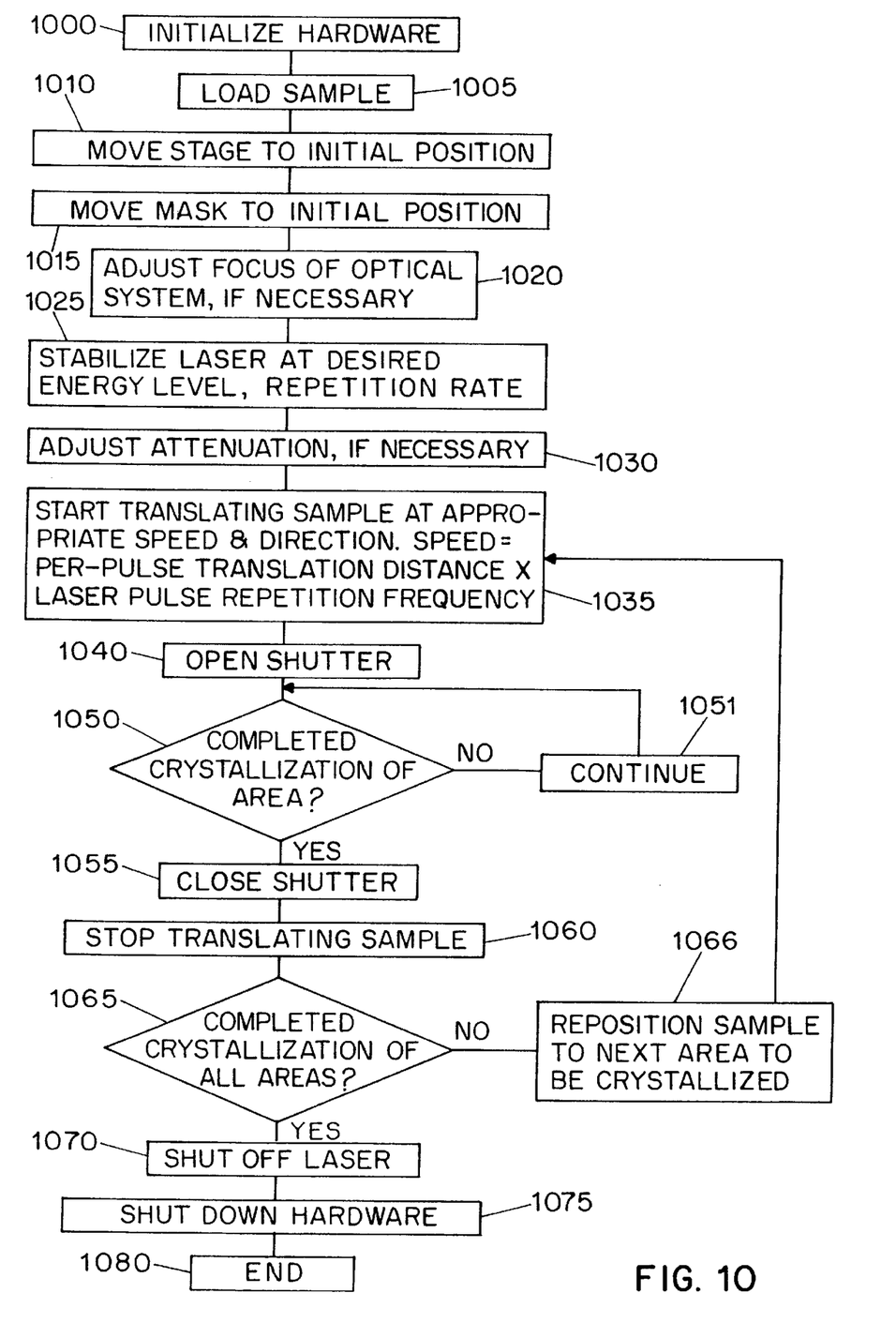
FIG. 10 is a flow diagram illustrating the basic steps implemented in the system of FIG. 1.
Figure 11:
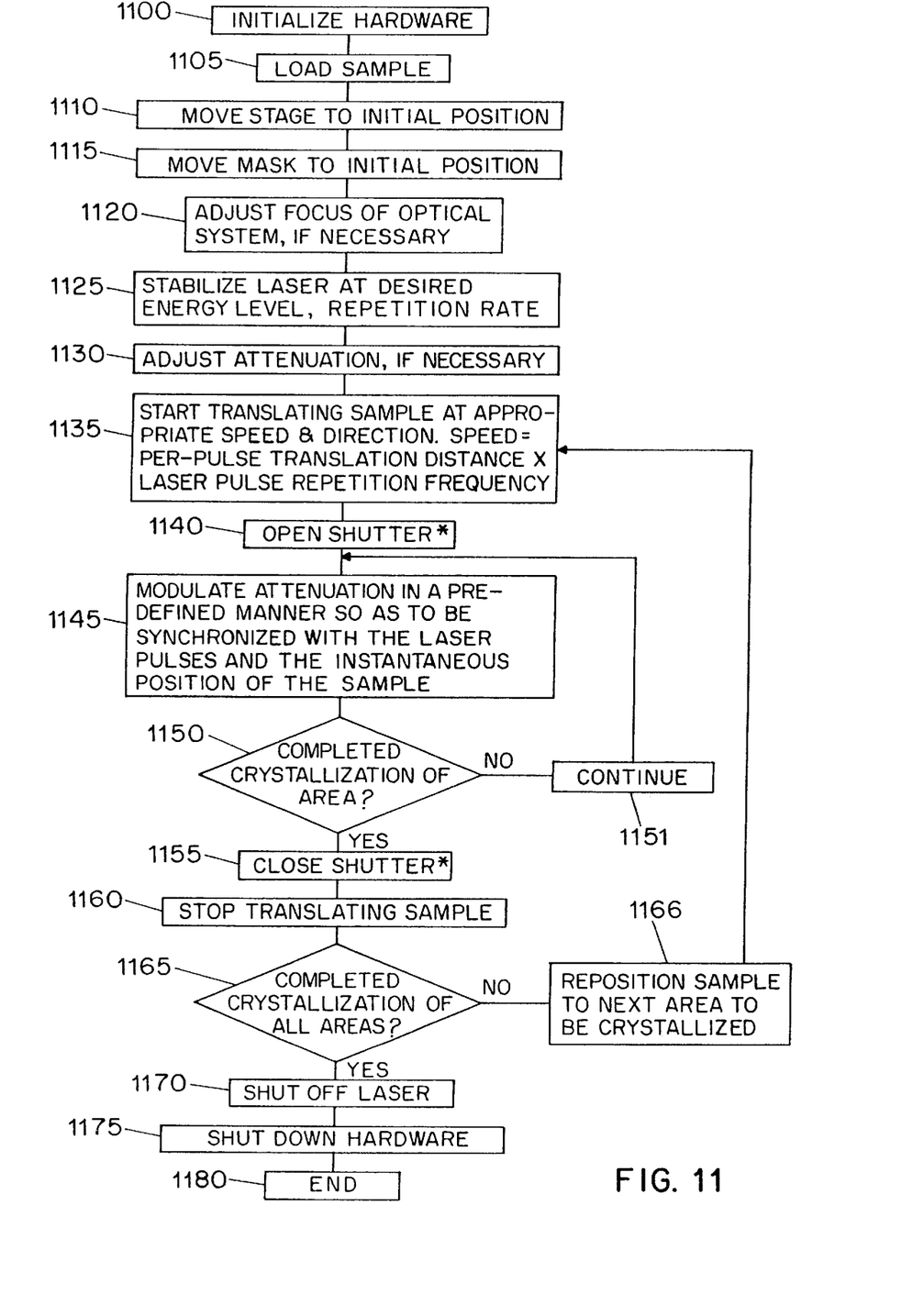
FIG. 11 is a flow diagram illustrating the steps implemented in the system of FIG. 1 with energy-density modulation.

Referring next to FIGS. 10 and 11, the steps executed by computer 100 to control the crystal growth process in accordance with the present invention will now be described. FIG. 10 is a flow diagram illustrating the basic steps implemented in the system of FIG. 1. The various electronics of the system shown in FIG. 1 are initialized 1000 by the computer to initiate the process. A thin silicon film sample is then loaded onto the sample translation stage 1005. It should be noted that such loading may be either manual or robotically implemented under the control of computer 100. Next, the sample translation stage is moved into an initial position 1015, which may include an alignment with respect to reference features on the sample. The various optical components of the system are focused 1020 if necessary. The laser is then stabilized 1025 to a desired energy level and reputation rate, as needed to fully melt the silicon sample in accordance with the particular processing to be carried out. If necessary, the attenuation of the laser pulses is finely adjusted 1030.

Next, translation of the sample is commenced 1035 at a predetermined speed and in a predetermined direction, in accordance with the desired microstructure of the sample. The shutter is opened 1040 to expose the sample to irradiation and accordingly, to commence the sequential lateral solidification process.

Sample translation and irradiation continues until that the desired crystallization has been competed 1050, 1051, at which time the computer closes the shutter and stops translation 1055, 1060. If other areas on the sample have been designated for crystallization, the sample is repositioned 1065, 1066 and the crystallization process is repeated on the new area. If no further areas have been designated for crystallization, the laser is shut off 1070, the hardware is shut down 1075, and the process is completed 1080. Of course, if processing of additional samples is desired or if the present invention is utilized for batch processing, steps 1005, 1010, and 1035–1065 can be repeated on each sample.

FIG. 11 is a flow diagram illustrating the steps implemented in the system of FIG. 1 with energy-density modulation. Steps 1100–1140, and 1150–1180 are identical to those described above with reference to FIG. 10 for steps 1000–1040, and 1050–1080. In order to implement energy-density modulation, the attenuation of the excimer laser pulses are modulated 1145 in a predefined manner so as to be synchronized with both the timing of the laser pulses emitted by the laser and the instantaneous position of the silicon sample being irradiated. In connection with the foregoing, the ability to vary the rate at which beam attenuators are moved to impact energy density modulation over the attenuation-modulation cycle may be desirable to achieve greater flexibility The foregoing merely illustrates the principles of the invention. Various modifications and alterations to the described embodiments will be apparent to those skilled in the art in view of the teachings herein. For example, while the foregoing describes a sample sitting on a translation stage, it may be advantageous to place the sample within a vacuum chamber or a chamber with a controlled atmosphere, such as one housing an inert gas, with the chamber lying atop the translation stage. Other types of homogenizers may be utilized, such as a fly's eye homogenizer. Instead of using a stacked XY translator, more precise translators having additional degrees of freedom may be utilized. Moreover, in order to insure that the excimer pulses are properly focused on the sample, an active focusing system may be utilized. It will thus be appreciated that those skilled in the art will be able to devise numerous systems and methods which, although not explicitly shown or described herein, embody the principles of the invention and are thus within the spirit and scope of the invention.

What is claimed is:

1. A system for processing an amorphous silicon thin film sample into a single or polycrystalline silicon thin film, comprising:
   (a) an excimer laser for generating a plurality of excimer laser pulses of a predetermined fluence;
   (b) an energy density modulator, optically coupled to said excimer laser, for controllably modulating said fluence of said excimer laser pulses emitted by said excimer laser;

(c) a beam homogenizer, optically coupled to said energy density modulator, for homogenizing said modulated laser pulses in a predetermined plane;

(d) a mask, optically coupled to said beam homogenizer, for masking portions of said homogenized modulated laser pulses into patterned beamlets, (e) a sample stage, optically coupled to said mask, for receiving said patterned beamlets to effect melting of portions of any amorphous silicon thin film sample placed thereon corresponding to said beamlets;

(f) translating means, coupled to one or more of the group consisting of said sample stage and said mask, for controllably translating a relative position of said sample stage with respect to a position of said mask; and (g) a computer, coupled to said excimer laser, said energy density modulator, and said translating means, for controlling said controllable fluence modulation of said excimer laser pulses and said controllable relative positions of said sample stage and said mask, and for coordinating said excimer pulse generation and said fluence modulation with said relative positions of said sample stage and said mask, to thereby process said amorphous silicon thin film sample into a single or polycrystalline silicon thin film by sequential translation of said sample stage relative to said mask and irradiation of said sample by patterned beamlets of varying fluence at corresponding sequential locations thereon.

2. The system of claim 1, wherein said excimer laser is a ultraviolet excimer laser for generating ultraviolet excimer laser pulses.

3. The system of claim 1, wherein said energy density modulator comprises:

(a) a rotatable wheel;

(b) two or more beam attenuators circumferentially mounted on said wheel; and (c) a motor, mechanically coupled to said wheel and coupled to said computer, for controllably rotating said wheel such that each sequential pulse emitted by said laser passed through one of said two or more beam attenuators.

4. The system of claim 3, wherein said two or more beam attenuators are capable of producing at least two different levels of fluence attenuation.

5. The system of claim 3, wherein at least one of said two or more beam attenuators does not attenuate beam fluence and at least one different attenuator causes fluence attenuation.

6. The system of claim 1, wherein said energy density modulator comprises a multilayer dielectric plate, optically coupled to said excimer laser and rotatable about an axis perpendicular to a path formed by said excimer pulses, and variably fluence modulating said excimer pulses in dependence of an angle formed between said excimer pulse path and said axis of rotation.

7. The system of claim 6, further comprising a compensating plate, optically coupled to said multilayer dialectic plate, for compensating for translation of said excimer pulse path caused by said multilayer dialectic plate.

8. The system of claim 1, wherein said energy density modulator comprises:

(b) one or more beam attenuators; and (b) a translating stage, mechanically coupled to each of said two or more beam translators and coupled to said computer, for controllably translating said one or more beam attenuators such that each sequential pulse emitted by said laser passes through one of said one or more beam attenuators or passes through said energy density modulator without passing through any of said one or more beam attenuators.

9. The system of claim 8, wherein said translating stage is movable in both a direction parallel to a path formed by said excimer pulses and a direction perpendicular to said path, and wherein said one or more beam attenuators are positionable such that said excimer pulses pass through one of said one or more beam attenuators or through none of said one or more beam attenuators.

10. The system of claim 1, wherein said energy density modulator comprises one or more movable beam attenuators, coupled to said computer, and being controllably moved such that each sequential pulse emitted by said laser passes through one or more of said one or more beam attenuators or passes through said energy density modulator without passing through any of said one or more beam attenuators.

11. The system of claim 1, further comprising a shutter optically coupling said beam attenuator to said beam homogenizer and permitting said attenuated beams to pass through when placed in an open position and blocking said attenuating beams when placed in a closed position.

12. The system of claim 1, further comprising telescoping lens optics optically coupling said beam attenuator to said beam homogenizer and shaping said attenuated beams to match said beam homogenizer.

13. The system of claim 1, wherein said translating means comprises:

(a) a mask translating stage, mechanically coupled to said mask, and translatable in both orthogonal directions that are perpendicular to a path formed by said homogenized beams; and (b) a translating stage motor, mechanically coupled to said mask translating stage and coupled to said computer, for controllably translating said mask translating stage in both of said translatable directions under control of said computer.

14. The system of claim 1, wherein said translating means comprises said sample translating stage, and wherein said sample translating stage includes an X direction translation portion and a Y direction translation portion, each being coupled to said computer and to each other, said X and Y direction translation portions permitting movement in two orthogonal directions that are perpendicular to a path formed by said patterned beamlets and being controllable by said computer for controllably translating said sample in both of said translatable directions under control of said computer.

15. The system of claim 14, wherein said sample translation stage further comprises a Z direction translation portion, coupled to said computer and to at least one of said X and Y direction translation portions, for permitting movement of said sample in a direction parallel to said path formed by said patterned beamlets.

16. The system of claim 14, further comprising a granite block, mechanically coupled to said translating means on a side thereof opposite to a side to which said sample is applied, for stabilizing said sample from ambient vibration.

17. The system of claim 1, wherein said sequential locations of said sample are irradiated by a sequence of said excimer laser pulses, whereon a first location of said sequential locations is irradiated by a first laser pulse of the sequence of said excimer laser pulses, and wherein a second locations of said sequential locations is irradiated by a second laser pulse of the sequence of said excimer laser pulses, an emission of said second pulse immediately following an emission of said first laser pulse.

18. The system of claim 1, wherein said computer coordinates said excimer pulse generation and said fluence modulation with said relative positions of said sample stage and said mask during the irradiation of said sample.

19. The system of claim 1, wherein said computer coordinates said excimer pulse generation and said fluence modulation with said relative positions of said sample stage and said mask in real-time.

20. The system of claim 1, wherein the mask includes a pattern which has an array of slits.

21. The system of claim 1, wherein the mask includes a pattern which has an array of chevrons.

* * * * *

UNITED STATES PATENT AND TRADEMARK OFFICE
CERTIFICATE OF CORRECTION

PATENT NO.    : 6,573,531 B1
DATED         : June 3, 2003
INVENTOR(S)   : Im et al.

It is certified that error appears in the above-identified patent and that said Letters Patent is hereby corrected as shown below:

Title page,
Item [56], References Cited, OTHER PUBLICATIONS, insert
-- Sposili et al., "Single-Crystal Si Films via a Low-Substrate-Temperature Excimer-Laser Crystallization Method", Mat. Res. Soc. Symp. Proc. Vol 452, page 953-958, 1997 Materials Research Society.

Kim, H.J., "Excimer-Laser-Induced Crystalline of Amorphous Silicon Thin Films", Ph. D. Dissertation Abstract, Columbia University, 1996.

Sposili et al., "Sequential Lateral Solidification of Thin Silicon Films on SiO2, Appl. Phys. Lett., 69(19), p 2864, 1996.

Im et al., "Single-Crystal Si Films for Thin-Film Transistor Devices, App. Phys. Lett., 70 (25), p.3434, 1997. --

"H. Endert et al.," reference, "Micromaching" should read -- Micromachining --

Item [57], ABSTRACT,
Line 7, "homoginizer" should read -- homogenizer --; and "homoginizing" should read -- homogenizing --
Line 9, "homoginized" should read -- homogenized --
Line 10, "receivingthe" should read -- receiving the --

Column 1,
Line 23, "Bullitin" should read -- Bulletin --
Line 35, "a" should be deleted Column 2,
Line 5, "homoginizer" should read -- homogenizer --; and "homoginizing" should read -- homogenizing --
Lines 7 and 65, "homoginized" should read -- homogenized --
Line 8, "receivingthe" should read -- receiving the --
Line 27, "circumfcrentially" should read -- circumferentially --
Line 29, "passed" should read -- passes --
Line 37, "dependance" should read -- dependence --
Line 40, "path," should read -- path. --

UNITED STATES PATENT AND TRADEMARK OFFICE
CERTIFICATE OF CORRECTION

PATENT NO. : 6,573,531 B1
DATED : June 3, 2003
INVENTOR(S) : Im et al.

It is certified that error appears in the above-identified patent and that said Letters Patent is hereby corrected as shown below:

Column 3,
Line 12, "stabilizing" should read -- stabilize --
Line 20, "homoginizing" should read -- homogenizing --
Line 21, "homoginized" should read -- homogenized --
Line 22, "beamlets," should read -- beamlets; --
Line 35, "embodiment" should read -- embodiments --

Column 4,
Line 24, "Microlas" should read -- Micro/Las --

Column 5,
Line 6, "floride" should read -- fluoride --
Line 38, "eximer" should read -- excimer --
Line 41, "eight" should read -- eighth --

Column 6,
Lines 7 and 11, "attenuations" should read -- attenuators --
Line 21, "non" should read -- non- --
Line 41, "attenuation" should read -- attenuator --
Line 46, "columnated" should read -- collimated --

Column 7,
Line 49, "liquified" should read -- liquefied --

Column 8,
Line 4, "reputation" should read -- repetition --
Line 13, "that" should be deleted
Line 14, "competed" should read -- completed --

UNITED STATES PATENT AND TRADEMARK OFFICE
CERTIFICATE OF CORRECTION

PATENT NO. : 6,573,531 B1
DATED : June 3, 2003
INVENTOR(S) : Im et al.

It is certified that error appears in the above-identified patent and that said Letters Patent is hereby corrected as shown below:

Column 9,
Line 6, "beamlets," should read -- beamlets; --
Line 8, "beamiets" should read -- beamlets --
Line 30, "a" should read -- an --
Line 41, "passed" should read -- passes --

Column 10,
Line 62, "whereon" should read -- wherein --
Line 66, "locations" should read -- location --

Signed and Sealed this

Ninth Day of December, 2003

JAMES E. ROGAN
*Director of the United States Patent and Trademark Office*